United States Patent [19]
Cohen et al.

[11] 3,980,047
[45] Sept. 14, 1976

[54] AUTOMATIC TONING DEVICE

[75] Inventors: Abraham B. Cohen, Springfield; Michael J. Krawacki, Union, both of N.J.

[73] Assignee: E. I. Du Pont de Nemours and Company, Wilmington, Del.

[22] Filed: Nov. 15, 1974

[21] Appl. No.: 524,202

[52] U.S. Cl. .................... 118/608; 118/109; 118/262; 401/21; 222/171
[51] Int. Cl.² .................. B05C 11/10; B05C 17/02
[58] Field of Search .................... 401/218, 21, 22; 118/637, 109, 262, 608, 610; 222/169, 171, 172

[56] References Cited
UNITED STATES PATENTS

| | | | |
|---|---|---|---|
| 1,141,478 | 6/1915 | Mount | 401/21 |
| 2,632,583 | 3/1953 | Allen | 401/22 X |
| 3,532,071 | 10/1970 | McCarroll | 118/637 |
| 3,574,301 | 4/1971 | Bernhard | 118/637 |

*Primary Examiner*—John P. McIntosh

[57] ABSTRACT

An apparatus for the application of a controlled quantity of finely divided particulate material on a tacky surface, without imparting any shearing force, having a porous, rotating, laterally movable, cylindrical cartridge for storing and dispensing said particulate material which performs a sieving operation to break up particle aggregates prior to dispensing said particulate material, a roller for transferring said particulate material from the dispensing cartridge to the tacky surface as the roller moves over said surface and, a housing for said elements.

5 Claims, 6 Drawing Figures

AUTOMATIC TONING DEVICE

BACKGROUND OF THE INVENTION

1. Field of the Invention

This invention relates to an apparatus for dispensing and applying finely divided particulate or granular matter on a tacky surface. More particularly this invention relates to a device for breaking up particle aggregates by utilizing a sieving operation and assuring a controlled and uniform dispensing and deposition of said material.

While the apparatus of this invention is of general utility in the dispensing of finely divided particulate matter, it is particularly well suited for dispensing a uniform layer of toner on an imagewise exposed photohardenable layer.

2. Description of the Prior Art.

A number of devices have been developed to apply toner on an imagewise exposed surface as a result of the wide commercial acceptance of electrophotography. Thus, a variety of devices and techniques are known for applying electroscopic powders.

U.S. Pat. No. 3,374,768 discloses a developing apparatus which employs a powder cloud for developing electrostatic images formed on a photoconductive surface. The use of such an apparatus, however, can create an ambient dust problem and necessitates the use of expensive dust removal systems.

When a transfer roll type toner application system is used, it is known in the art to use a hopper from which a quantity of toner is transferred to an intermediate or dispensing roller prior to pick up by an applicator roller. Such an intermediate roller is usually provided with scoops on its outside surface which helps transfer a fixed quantity of toner from the hopper to the applicator roller.

This procedure of transferring a fixed quantity of toner using an intermediate or dispensing roller provided with scoops on its outer surface is disclosed in U.S. Pat. No. 3,622,054. The toner is transferred from a flaccid, baglike container to a supply of developer material using said intermediate roll. A frictionally driver brush roll provided with semirigid bristles is used to prevent the agglomeration of the toner powder or bridging of the powder above the dispensing roll.

In U.S. Pat. No. 3,125,465 a sheet duster comprising an applicator roll and a transfer roll which transfers a powdered lubricant from a supply bin or hopper to the applicator roll is disclosed. The supply bin is vibrated to prevent the formation of particle agglomerates. This apparatus however would have to be used in a closed environment where special means are available to avoid powdered lubricant from spreading over the work area. U.S. Pat. Nos. 3,532,071 and 3,592,725 also disclose particle application to a surface.

In the application of a toner on an exposed, photohardenable layer, advantage is taken of the difference in adhesion between areas exposed to actinic radiation and non-exposed areas, to render an image visible. A simple device is needed which will reproducibly apply a substantially uniform toner layer so as to produce a toned area without streaks and mottle.

The need for a simple and inexpensive device to do this is greater when a multicolored image is to be reproduced, where toner layers of different colors are to be used in sequence as described in U.S. Pat. No. 3,649,268. In addition, most of the prior art devices are intended for use in a closed environment such as inside a machine, where special means are available to avoid toner dust from spreading over the work area. There is need for a simple toner applicator which can apply toner without generating a dust cloud and which can be used by an operator without special dust removing or filtering means.

SUMMARY OF THE INVENTION

It is an object of this invention to provide an improved device for the application of particulate or granular material to a tacky surface especially a surface having tacky and non-tacky areas. It is a further object of the invention to provide such a device having a means for breaking up particle aggregates to assure the uniform dispensing of the material. It is a still further object of this invention to meter and apply a controlled amount of toner using a simple, inexpensive device which may be hand operated or in the alternative automatically driven over the area which is to be toned without creating a dust cloud.

The above objectives are realized in an apparatus which comprises (1) means for breaking up agglomerates in particulate material to form smaller particles of controlled size and for dispensing the particles to a depositing means, and (2) depositing the particles to a tacky surface without applying shear force.

In another embodiment of the invention, the apparatus additionally comprises means for embedding particles in the tacky surface using a force having a shear component.

DESCRIPTION OF THE PREFERRED EMBODIMENTS

Figure 1:
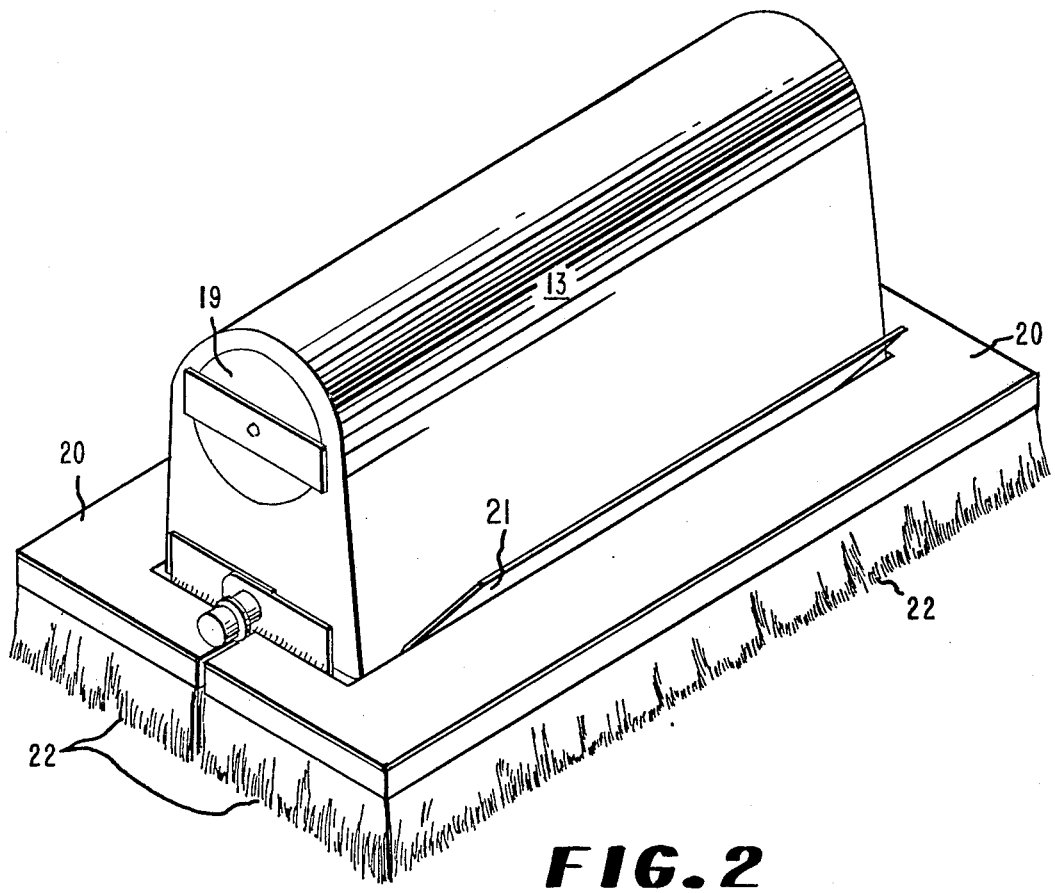
FIG. 1 is a perspective view of an applicator device of the invention having wing pads in working position.
Figure 2:
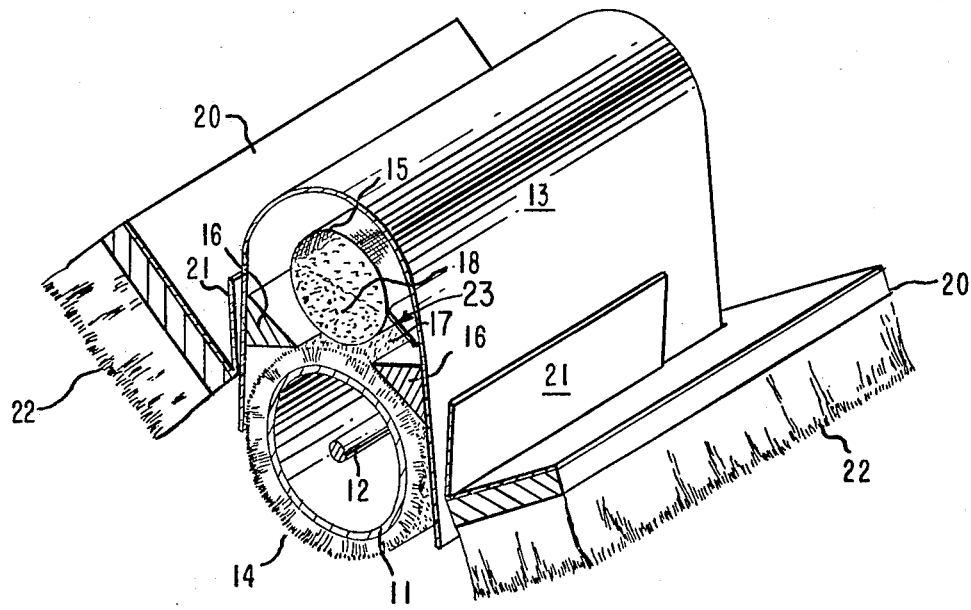
FIG. 2 is a cross section view of the device with wing pads retracted upward.
Figure 3:
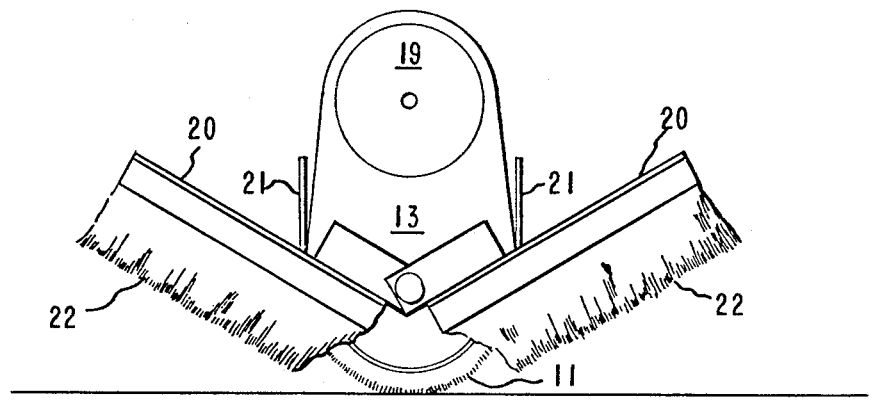
FIG. 3 is a schematic view demonstrating deposition of particulate material using the device of FIG. 1.
Figure 4:
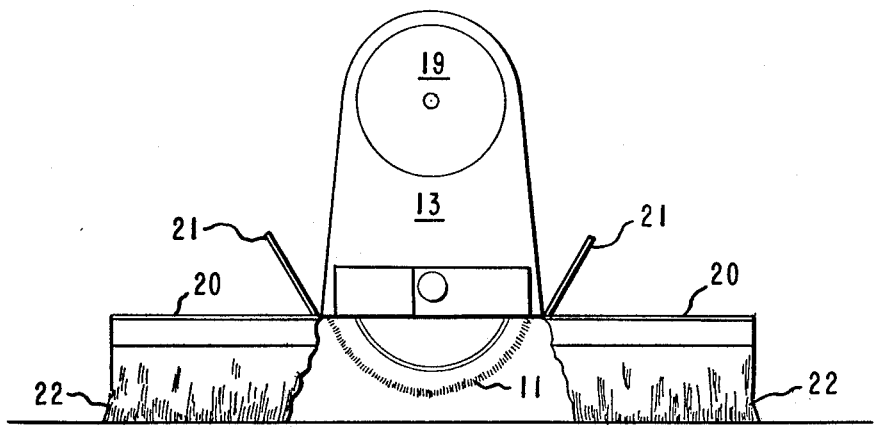
FIG. 4 is a schematic view demonstrating embedding the material into a tacky surface using the device of FIG. 1.
Figure 5:
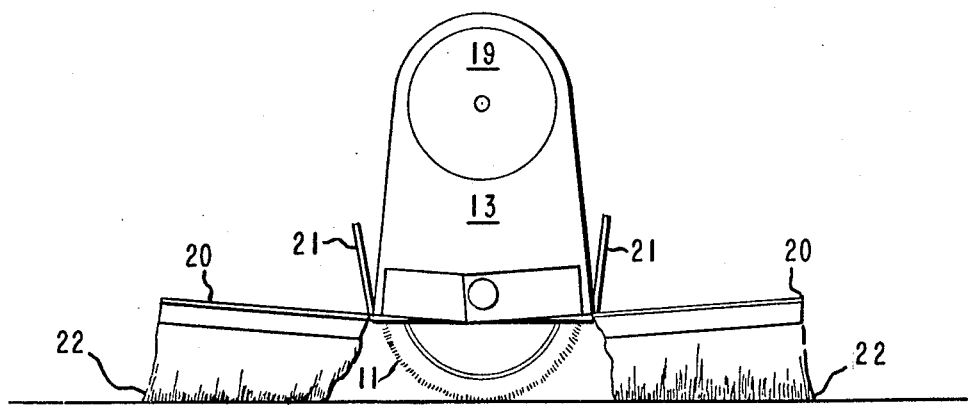
FIG. 5 is a schematic view demonstrating concurrent dispensing, deposition and embedding of the material into a tacky surface using the device in FIG. 1.
Figure 6:
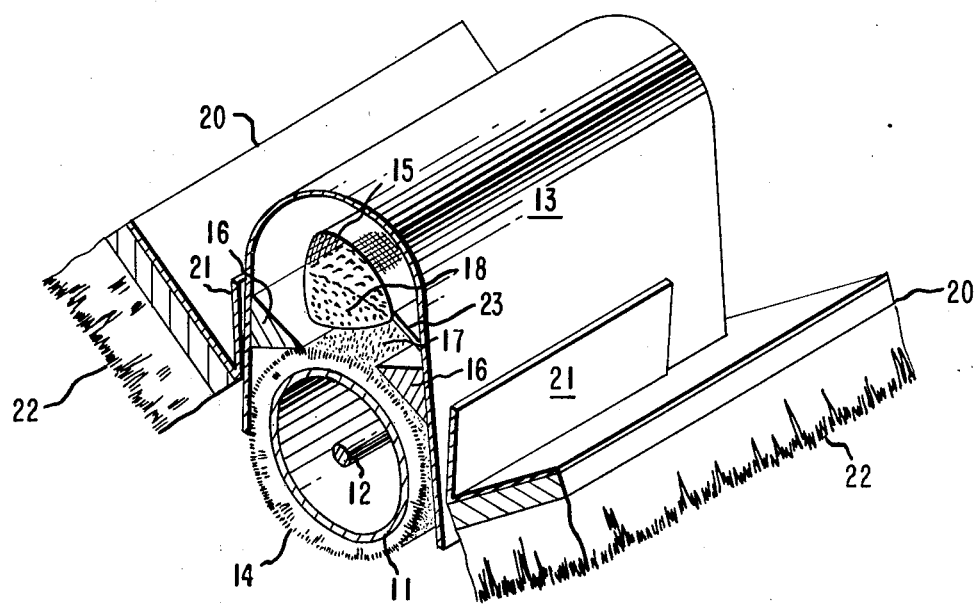
FIG. 6 is a cross section view of the device showing an alternate embodiment of the cylindrical sieve having non-circular cross section.

In a preferred embodiment of the invention, the means for breaking up aggregates and dispensing the particle comprises a cylindrical sieve, which may have a circular or non-circular cross section and which is driven by the depositing means which is comprised of at least one roller. This cylindrical sieve is free to move laterally (perpendicular to its axis) and the freedom of its movement may be governed by an adjustably positionable member. Preferably, the apparatus comprises a housing within which the sieve and depositing roller are contained. The cylindrical sieve is free to rotate and to move laterally within the housing. The sieve may have a surface with a plurality of holes such as a mesh of, for example, 40 to 90 mesh, and the preferred mesh size being 60 (0.007 inch). Referring to the figures, a particularly preferred apparatus of the invention comprises a roller applicator 11 mounted by means of axle 12 to the open end of a housing 13 so that the applicator roller 11 freely rotates about the axle and so that the length of the roll applicator surface 14 extends outside of the open end of the housing 13. An elongated sifting means 15 comprising a cylindrical container having a plurality of holes distributed circumferentially thereon is confined within the housing 13 by the roll applicator 11 and baffles 16. The baffles 16 run parallel to the applicator 11 and sifting means 15 and are attached to the housing at points between the axis of the roll applicator and the axis of the sifting means. The sifting means 15 is laterally free moving within the housing 13 and its outer surface is in contact with the top surface 17 of the roll applicator 11 so that it can be rotated and moved from side to side as the roll applicator is rotated in alternate directions. An adjustably positionable member 23 may be used to govern the freedom of lateral movement of the cylindrical sieve within the housing and thereby govern the rate of dispensing from the sieve. Particulate toner material 18 is contained within the cavity of the sieving means 15. The sieving means 15 may be removed from the housing 13 for filling with toner material by first removing the cap 19 on the housing 13. Around the opening of the housing 13 two pad sections 20 or wing pads are hinged on the axle 12 so that they can be retracted up around the housing 11, or be lowered parallel to the housing opening by squeezing or releasing handles, 21. When the wing pads are retracted only the surface of the roll applicator 14 touches when the device is moved over a surface to and fro as in FIG. 3. When the wing pads are fully lowered only the pad areas 22 touch when the device is moved over a surface to and fro as in FIG. 4. When the wing pads are only partially retracted, for instance when downward pressure is placed on the housing 13, both the roll applicator surface 14 and the pad areas 22 touch the surface when the device is moved to and fro as in FIG. 5.

What is claimed is:

1. An apparatus for applying particulate material to a tacky surface comprising, within a housing:
    1. a cylindrical sieve for breaking up agglomerates in the particulate material to form smaller particles of controlled size and for dispensing the particles to a depositing means; and
    2. depositing means comprising at least one roller for applying the particles to a tacky surface without applying shear force, wherein said cylindrical sieve is driven by said roller and is free to move laterally within said housing.

2. An apparatus according to claim 1 wherein said cylindrical sieve has a non-circular cross section.

3. An apparatus according to claim 1 wherein the freedom of movement of said cylindrical sieve is governed by an adjustably positionable member in said housing.

4. An apparatus according to claim 1 having means for embedding particles into a tacky surface.

5. An apparatus according to claim 4 wherein said means for embedding comprises one or more retractable pads.

* * * * *